United States Patent
Selvaraj et al.

(10) Patent No.: US 12,371,173 B1
(45) Date of Patent: Jul. 29, 2025

(54) SUSTAINABLE HYBRID PIEZOELECTRIC MATRIX ICE PROTECTION SYSTEM

(71) Applicant: GOODRICH CORPORATION, Charlotte, NC (US)

(72) Inventors: Sugumaran Selvaraj, Bangalore (IN); Galdemir C. Botura, Copley, OH (US); Jin Hu, Cary, NC (US); Nathaniel Ching, Hartville, OH (US); Rhushikesh Patil, Bengaluru (IN); Shyam Kumar Dattatri, Bangalore (IN)

(73) Assignee: Goodrich Corporation, Charlotte, NC (US)

( * ) Notice: Subject to any disclaimer, the term of this patent is extended or adjusted under 35 U.S.C. 154(b) by 0 days.

(21) Appl. No.: 18/629,700

(22) Filed: Apr. 8, 2024

(30) Foreign Application Priority Data

Jan. 17, 2024 (IN) .............................. 202441003307

(51) Int. Cl.
*B64D 15/16* (2006.01)
*B06B 1/06* (2006.01)
(Continued)

(52) U.S. Cl.
CPC .............. *B64D 15/163* (2013.01); *B06B 1/06* (2013.01); *B64D 15/22* (2013.01); *H02N 2/186* (2013.01); *H10N 30/20* (2023.02); *H10N 30/30* (2023.02)

(58) Field of Classification Search
CPC ...... B64D 15/16; B64D 15/163; B64D 15/22; B06B 1/06; H02N 2/186; H10N 30/20; H10N 30/30
See application file for complete search history.

(56) References Cited

U.S. PATENT DOCUMENTS

| 5,195,046 A * | 3/1993 | Gerardi .................. B64D 15/20 73/659 |
| 5,206,806 A * | 4/1993 | Gerardi ............... G01M 5/0016 244/134 F |

(Continued)

FOREIGN PATENT DOCUMENTS

| CA | 2852444 | 10/2016 |
| CN | 206939090 | 1/2018 |

OTHER PUBLICATIONS

Li, Tao, et al. "Piezoelectric Energy Harvesting Technology: From Materials, Structures, to Applications." Small Structures. (Year: 2022).*

(Continued)

*Primary Examiner* — Joshua J Michener
*Assistant Examiner* — Michael B. Kreiner
(74) *Attorney, Agent, or Firm* — SNELL & WILMER L.L.P.

(57) ABSTRACT

A sustainable hybrid piezoelectric matrix ice protection system is provided. The system includes at least one energy harvester and anti-icing device and an energy storage device. Responsive to electrical power generated by the at least one energy harvester and anti-icing device being greater than a first threshold, the at least one energy harvester and anti-icing device stores the electrical power in the energy storage device. Responsive to the electrical power generated by the at least one energy harvester and anti-icing device being less than the first threshold, the at least one energy harvester and anti-icing device generates continuous, low-frequency vibrations for anti-icing.

20 Claims, 7 Drawing Sheets

(51) Int. Cl.
*B64D 15/22* (2006.01)
*H02N 2/18* (2006.01)
*H10N 30/20* (2023.01)
*H10N 30/30* (2023.01)

(56) References Cited

U.S. PATENT DOCUMENTS

| | | | |
|---|---|---|---|
| 7,737,608 B2 * | 6/2010 | Ruggeri | H10N 30/2041 |
| | | | 310/330 |
| 8,793,970 B2 * | 8/2014 | Le Docte | B64D 33/02 |
| | | | 60/39.093 |
| 8,888,047 B2 | 11/2014 | Chuc et al. | |
| 9,359,081 B2 * | 6/2016 | Clemen, Jr. | B64D 15/12 |
| 9,708,929 B2 | 7/2017 | Szwedowicz et al. | |
| 9,873,517 B2 * | 1/2018 | MacLean | B64D 15/16 |
| 10,063,164 B2 | 8/2018 | Apdalhaliem et al. | |
| 10,263,173 B2 * | 4/2019 | Najafi | H10N 30/2044 |
| 11,492,128 B2 * | 11/2022 | Gonidec | B64D 15/22 |
| 11,643,967 B2 | 5/2023 | Bourhis et al. | |
| 2024/0039429 A1 * | 2/2024 | Lu | H02N 2/186 |

OTHER PUBLICATIONS

European Patent Office, European Search Report dated May 19, 2025 in Application No. 25152518.4.

* cited by examiner

SUSTAINABLE HYBRID PIEZOELECTRIC MATRIX ICE PROTECTION SYSTEM

CROSS-REFERENCE TO RELATED APPLICATIONS

This application claims priority to, and the benefit of, India Provisional Patent Application No. 202441003307, filed Jan. 17, 2024 and titled "SUSTAINABLE HYBRID PIEZOELECTRIC MATRIX ICE PROTECTION SYSTEM," which is incorporated by reference herein in its entirety for all purposes.

FIELD

The present disclosure generally relates to an ice protection system and more specifically to a sustainable hybrid piezoelectric matrix ice protection system BACKGROUND Ice protection systems (IPS) allow aircraft pilots to exit icing conditions and avoid accidents due to rapid ice accumulation on leading surfaces of an aircraft. Various modes of IPS include pneumatic, electro-thermal, and electro-mechanical expulsion systems. Pneumatic deicing systems use engine bleed air to inflate rubber boots, generating shear stress to break and shed ice formed on leading edges. Electro-thermal deicing systems convert electrical energy to heat the leading-edge surfaces and shed ice by melting the ice at the ice-leading edge interface. Electro-mechanical deicing systems use electrical energy to actuate various elements/mechanisms on the leading-edge surface to impart shear stress to ice formation and shed the ice.

SUMMARY

A sustainable hybrid piezoelectric matrix ice protection system is disclosed herein. The system includes at least one energy harvester and anti-icing device and an energy storage device. Responsive to electrical power generated by the at least one energy harvester and anti-icing device being greater than a first threshold, the at least one energy harvester and anti-icing device stores the electrical power in the energy storage device. Responsive to the electrical power generated by the at least one energy harvester and anti-icing device being less than the first threshold, the at least one energy harvester and anti-icing device generates continuous, low-frequency vibrations for anti-icing.

In various embodiments, the at least one energy harvester and anti-icing device is disposed along an internal portion of a leading edge of an aircraft structure of an aircraft. In various embodiments, a low ice adhesion (LIA) coating is applied to an exterior portion of the leading edge of the aircraft structure.

In various embodiments, generating the continuous, low-frequency vibrations for anti-icing utilizes the electrical power from at least one of a power source or the energy storage device.

In various embodiments, the system further comprises at least one deicing device. In various embodiments, responsive to the electrical power generated by the at least one energy harvester and anti-icing device being less than the first threshold, the at least one deicing device draws the electrical power from a power source to generate periodic high-frequency vibrations for deicing by the at least one deicing device.

In various embodiments, the at least one deicing device is at least one of a high-frequency ultrasonic prestressed transducer, a high-frequency ultrasonic patch, or a high-frequency ultrasonic disk. In various embodiments, the at least one deicing device is disposed along an internal portion of upper and lower portions of an aircraft structure, downstream of a leading edge of the aircraft structure. In various embodiments, a low ice adhesion (LIA) coating is applied to an exterior portion of the upper and lower portions of the aircraft structure, downstream of the leading edge of the aircraft structure.

In various embodiments, the system further comprises at least one deicing device. In various embodiments, responsive to the electrical power generated by the at least one energy harvester and anti-icing device being less than the first threshold, the at least one deicing device draws the electrical power from a power source to generate periodic low-frequency vibrations for deicing by the at least one deicing device.

In various embodiments, the at least one deicing device is a low-frequency patch. In various embodiments, the at least one deicing device is disposed along an internal portion of upper and lower portions of an aircraft structure, downstream of a leading edge of the aircraft structure. In various embodiments, a low ice adhesion (LIA) coating is applied to an exterior portion of the upper and lower portions of the aircraft structure, downstream of the leading edge of the aircraft structure.

Also disclosed herein is an aircraft. The aircraft includes an aircraft structure and a sustainable hybrid piezoelectric matrix ice protection system. The sustainable hybrid piezoelectric matrix ice protection system includes at least one energy harvester and anti-icing device and an energy storage device. Responsive to electrical power generated by the at least one energy harvester and anti-icing device being greater than a first threshold, the at least one energy harvester and anti-icing device stores the electrical power in the energy storage device. Responsive to the electrical power generated by the at least one energy harvester and anti-icing device being less than the first threshold, the at least one energy harvester and anti-icing device, continuous generates low-frequency vibrations for anti-icing.

In various embodiments, the at least one energy harvester and anti-icing device is disposed along an internal portion of a leading edge of the aircraft structure of the aircraft. In various embodiments, a low ice adhesion (LIA) coating is applied to an exterior portion of the leading edge of the aircraft structure.

In various embodiments, the sustainable hybrid piezoelectric matrix ice protection system further includes a power source. In various embodiments, generating the continuous, low-frequency vibrations for anti-icing utilizes the electrical power from at least one of the power source or the energy storage device.

In various embodiments, the sustainable hybrid piezoelectric matrix ice protection system further includes at least one deicing device. In various embodiments, responsive to the electrical power generated by the at least one energy harvester and anti-icing device being less than the first threshold, the at least one deicing device draws the electrical power from a power source to generate periodic high-frequency vibrations for deicing by the at least one deicing device.

In various embodiments, the at least one deicing device is at least one of a high-frequency ultrasonic prestressed transducer, a high-frequency ultrasonic patch, or a high-frequency ultrasonic disk. In various embodiments, the at least one deicing device is disposed along an internal portion of upper and lower portions of the aircraft structure, downstream of a leading edge of the aircraft structure. In various embodiments, a low ice adhesion (LIA) coating is applied to an exterior portion of the upper and lower portions of the aircraft structure, downstream of the leading edge of the aircraft structure.

In various embodiments, the sustainable hybrid piezoelectric matrix ice protection system further includes at least one deicing device. In various embodiments, responsive to the electrical power generated by the at least one energy harvester and anti-icing device being less than the first threshold, the at least one deicing device draws the electrical power from a power source to generate periodic low-frequency vibrations for deicing by the at least one deicing device.

In various embodiments, the at least one deicing device is a low-frequency patch. In various embodiments, the at least one deicing device is disposed along an internal portion of upper and lower portions of the aircraft structure, downstream of a leading edge of the aircraft structure. In various embodiments, a low ice adhesion (LIA) coating is applied to an exterior portion of the upper and lower portions of the aircraft structure, downstream of the leading edge of the aircraft structure.

Also disclosed herein is a method for sustainable hybrid piezoelectric matrix ice protection system. The method includes receiving, by a controller, an indication of generated electrical power from at least one energy harvester and anti-icing device; determining, by the controller, whether electrical power generated by the at least one energy harvester and anti-icing device is greater than a first threshold; responsive to the electrical power generated by the at least one energy harvester and anti-icing device being greater than the first threshold, storing, by the controller, the electrical power in an energy storage device; and, responsive to the electrical power generated by the at least one energy harvester and anti-icing device being less than the first threshold, providing, by the controller, the electrical power to the at least one energy harvester and anti-icing device for generating continuous, low-frequency vibrations for anti-icing.

In various embodiments, the at least one energy harvester and anti-icing device is disposed along an internal portion of a leading edge of an aircraft structure of an aircraft. In various embodiments, a low ice adhesion (LIA) coating is applied to an exterior portion of the leading edge of the aircraft structure.

In various embodiments, the controller provides the electrical power for generating the continuous, low-frequency vibrations for anti-icing from at least one of a power source or the energy storage device.

In various embodiments, the method further includes, responsive to the electrical power generated by the at least one energy harvester and anti-icing device being less than the first threshold, providing, by the controller, the electrical power to at least one deicing device for generating periodic high-frequency vibrations for deicing by the at least one deicing device.

In various embodiments, the at least one deicing device is at least one of a high-frequency ultrasonic prestressed transducer, a high-frequency ultrasonic patch, or a high-frequency ultrasonic disk. In various embodiments, the at least one deicing device is disposed along an internal portion of upper and lower portions of an aircraft structure, downstream of a leading edge of the aircraft structure. In various embodiments, a low ice adhesion (LIA) coating is applied to an exterior portion of the upper and lower portions of the aircraft structure, downstream of the leading edge of the aircraft structure.

In various embodiments, the method further includes, responsive to the electrical power generated by the at least one energy harvester and anti-icing device being less than the first threshold, providing, by the controller, the electrical power to at least one deicing device for generating periodic low-frequency vibrations for deicing by the at least one deicing device. In various embodiments, the at least one deicing device is a low-frequency patch. In various embodiments, the at least one deicing device is disposed along an internal portion of upper and lower portions of an aircraft structure, downstream of a leading edge of the aircraft structure. In various embodiments, a low ice adhesion (LIA) coating is applied to an exterior portion of the upper and lower portions of the aircraft structure, downstream of the leading edge of the aircraft structure.

The foregoing features and elements may be combined in any combination, without exclusivity, unless expressly indicated herein otherwise. These features and elements as well as the operation of the disclosed embodiments will become more apparent in light of the following description and accompanying drawings.

BRIEF DESCRIPTION OF THE DRAWINGS

The subject matter of the present disclosure is particularly pointed out and distinctly claimed in the concluding portion of the specification. A more complete understanding of the present disclosure, however, may best be obtained by referring to the following detailed description and claims in connection with the following drawings. While the drawings illustrate various embodiments employing the principles described herein, the drawings do not limit the scope of the claims.

DETAILED DESCRIPTION

The following detailed description of various embodiments herein makes reference to the accompanying drawings, which show various embodiments by way of illustration. While these various embodiments are described in sufficient detail to enable those skilled in the art to practice the disclosure, it should be understood that other embodiments may be realized and that changes may be made without departing from the scope of the disclosure. Thus, the detailed description herein is presented for purposes of illustration only and not of limitation. While these exemplary embodiments are described in sufficient detail to enable those skilled in the art to practice the invention, it should be understood that other embodiments may be realized and that logical, chemical, and mechanical changes may be made without departing from the spirit and scope of the invention. For example, the steps recited in any of the method or process descriptions may be executed in any order and are not necessarily limited to the order presented. Furthermore, any reference to singular includes plural embodiments, and any reference to more than one component or step may include a singular embodiment or step. Also, any reference to attached, fixed, connected, or the like may include permanent, removable, temporary, partial, full or any other possible attachment option. Additionally, any reference to without contact (or similar phrases) may also include reduced contact or minimal contact. It should also be understood that unless specifically stated otherwise, references to "a," "an," or "the" may include one or more than one and that reference to an item in the singular may also include the item in the plural. Further, all ranges may include upper and lower values and all ranges and ratio limits disclosed herein may be combined.

An aircraft must be pushed through the air to generate lift. Aircraft wings may generate most of the lift associated with holding the aircraft in the air. Accordingly, aircraft wings may be shaped as an airfoil. An airfoil may be a cross-sectional shape of an object whose motion through a fluid is capable of generating lift. The air may resist aircraft motion in the form of aerodynamic drag. Turbine engines may provide thrust to overcome drag and push the aircraft forward. A wing's aerodynamic efficiency may be expressed as a lift-to-drag ratio. A high lift-to-drag ratio may be associated with a smaller thrust to propel the wings through the air at sufficient lift, and vice versa.

Ice formation on a leading edge of a wing, as well as other aircraft structures, such as vertical stabilizers or horizontal stabilizers, among others, may disrupt or destroy the smooth flow of air along the aircraft structures, increasing drag while decreasing the ability of the wing to create lift. Accordingly, ice formation on the leading edge of an aircraft structures may prevent an aircraft from taking off, or worse, may interfere with flight.

While pneumatic deicing systems use engine bleed air to inflate rubber boots, generating shear stress to break and shed ice formed on leading edges, such pneumatic deicing systems may not be compatible with future all-electric aircrafts and further, pneumatic deicing systems have limited longevity due to erosion and environmental conditions. Additionally, while electro-thermal deicing systems convert electrical energy to heat the leading-edge surfaces and shed ice by melting the ice at the ice-leading edge interface, such electro-thermal deicing systems typically utilize a large amount of electricity, which may be detrimental to future all-electric aircrafts. Also, while electro-mechanical deicing systems use electrical energy to actuate various elements/mechanisms on the leading-edge surface to impart shear stress to ice formation and shed the ice, such electro-mechanical systems may be complex in construction and may not provide efficient ice-shedding.

Disclosed herein is a sustainable hybrid piezoelectric matrix ice protection system. This system includes at least one at least one energy harvester and anti-icing device, at least one deicing device, a controller including an electrical power monitoring mechanism, and an energy storage device. In various embodiments, the at least one energy harvester and anti-icing device is configured to be located inside a leading edge of the aircraft structure covering a stagnation zone. In various embodiments, the electrical power monitoring mechanism of the controller is configured to monitor the electrical power generated by the at least one energy harvester and anti-icing device and determine whether the electrical power generated by the at least one energy harvester and anti-icing device is greater than a first threshold and that electrical power drawn by the at least one energy harvester and anti-icing device is less than a second threshold. In various embodiments, the at least one energy harvester and anti-icing device is configured to function as an energy harvester during dry flight conditions. In that regard, in various embodiments, responsive to the electrical power generated by the at least one energy harvester and anti-icing device being greater than the first threshold and electrical power drawn by the at least one energy harvester and anti-icing device being less than the second threshold, the harvested electrical power harvested by the at least one energy harvester and anti-icing device is stored in the energy storage device. In various embodiments, during icing conditions, the electrical power generated by the at least one energy harvester and anti-icing device may drop below the first threshold. In various embodiments, the at least one energy harvester and anti-icing device is further configured to, responsive to the electrical power generated by the at least one energy harvester and anti-icing device dropping below the first threshold thereby indicating an icing condition, function as a low-frequency actuator for anti-icing. In various embodiments, the at least one deicing device is configured to be located downstream, i.e., in an aft direction of the aircraft, of the leading edge. In various embodiments, the at least one deicing device is configured to, responsive to the electrical power generated by the at least one energy harvester and anti-icing device dropping below the first threshold thereby indicating an icing condition, activate at predetermined time intervals to provide either high-frequency deicing or low-frequency deicing of areas of the aircraft structure downstream of the leading edge.

As used herein, "aft" refers to the direction associated with the tail (e.g., the back end) of an aircraft, or generally, to the direction of exhaust of the gas turbine. As used herein, "forward" refers to the direction associated with the nose (e.g., the front end) of an aircraft, or generally, to the direction of flight or motion.

Figure 1:
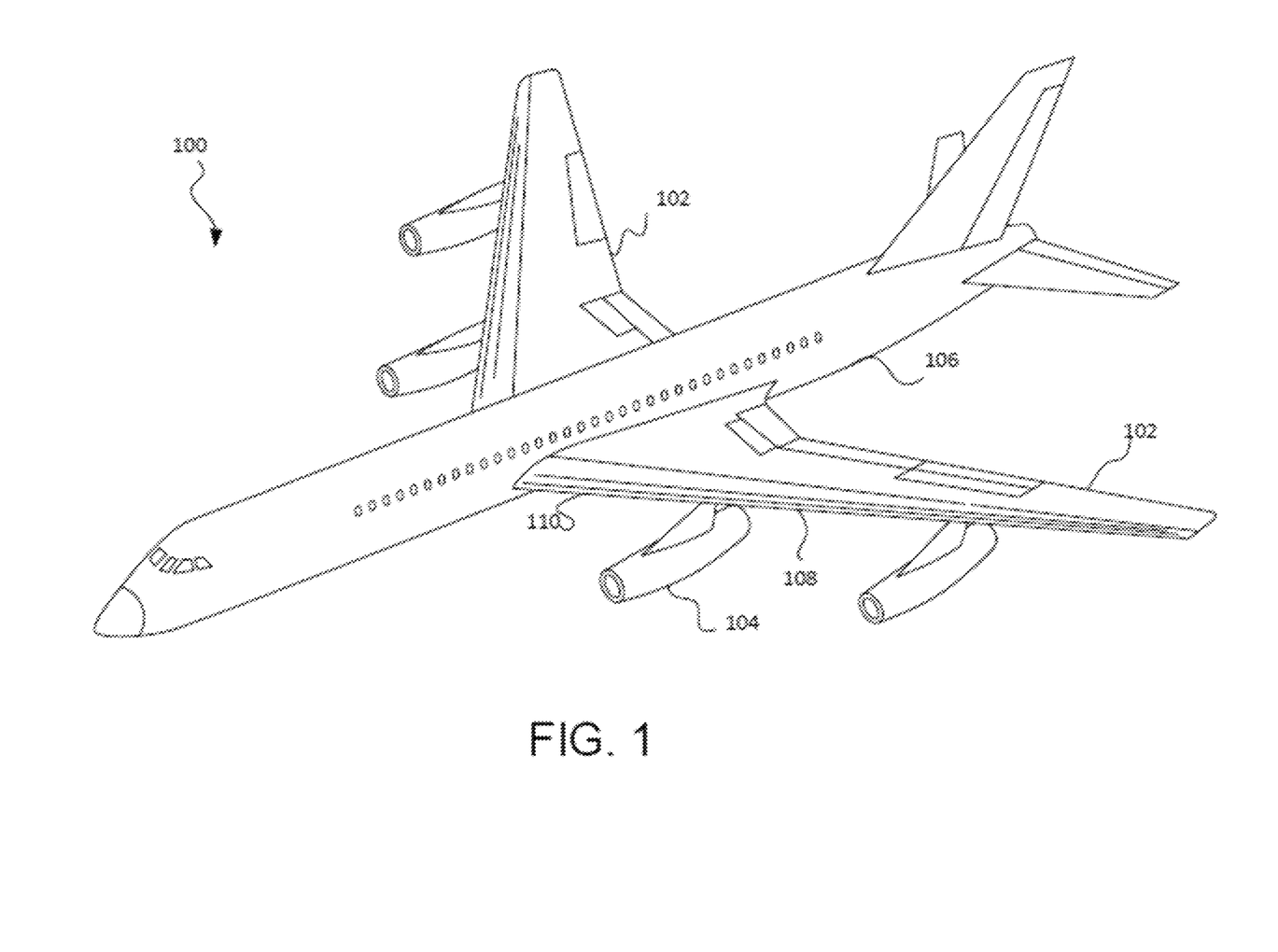
FIG. 1 illustrates an aircraft, in accordance with various embodiments.

Referring to FIG. 1, in accordance with various embodiments, an aircraft 100 is illustrated. The aircraft 100 may comprise wings 102 to generate lift, turbine engines 104 to provide thrust, and a fuselage 106 to hold the aircraft components together and carry passenger and cargo. The wings 102 may further comprise a deicing assembly 108 along the leading edge 110 of the wings.

Figure 2:
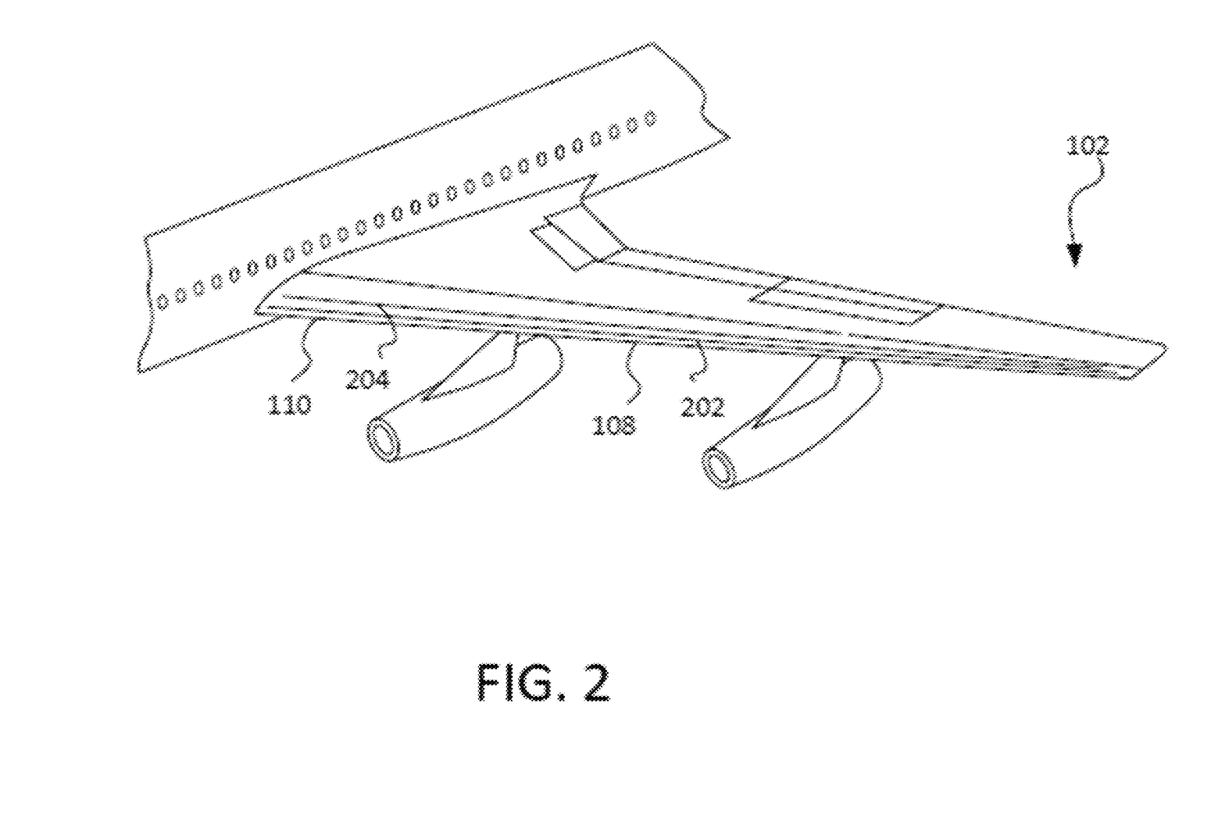
FIG. 2 illustrates an aircraft wing, in accordance with various embodiments.

Referring to FIG. 2, in accordance with various embodiments, the wings 102 is illustrated. In various embodiments, the wings 102 may comprise the deicing assembly 108. In various embodiments, the deicing assembly 108 may include at least one energy harvester and anti-icing device 202 and at least one deicing device 204. In various embodiments, the at least one energy harvester and anti-icing device 202 may be disposed along the leading edge 110 of the wings 102. In various embodiments, the at least one energy harvester and anti-icing device 202 may be a prestressed flexible low-frequency piezoelectric patch. In various embodiments, the at least one deicing device 204 may be disposed downstream, i.e., in an aft direction of the aircraft, of the leading edge 110. In various embodiments, the at least one deicing device 204 may be a high-frequency ultrasonic prestressed transducer, a high-frequency ultrasonic patch, a high-frequency ultrasonic disk, or a low-frequency patch, or any combination thereof.

Figure 3:
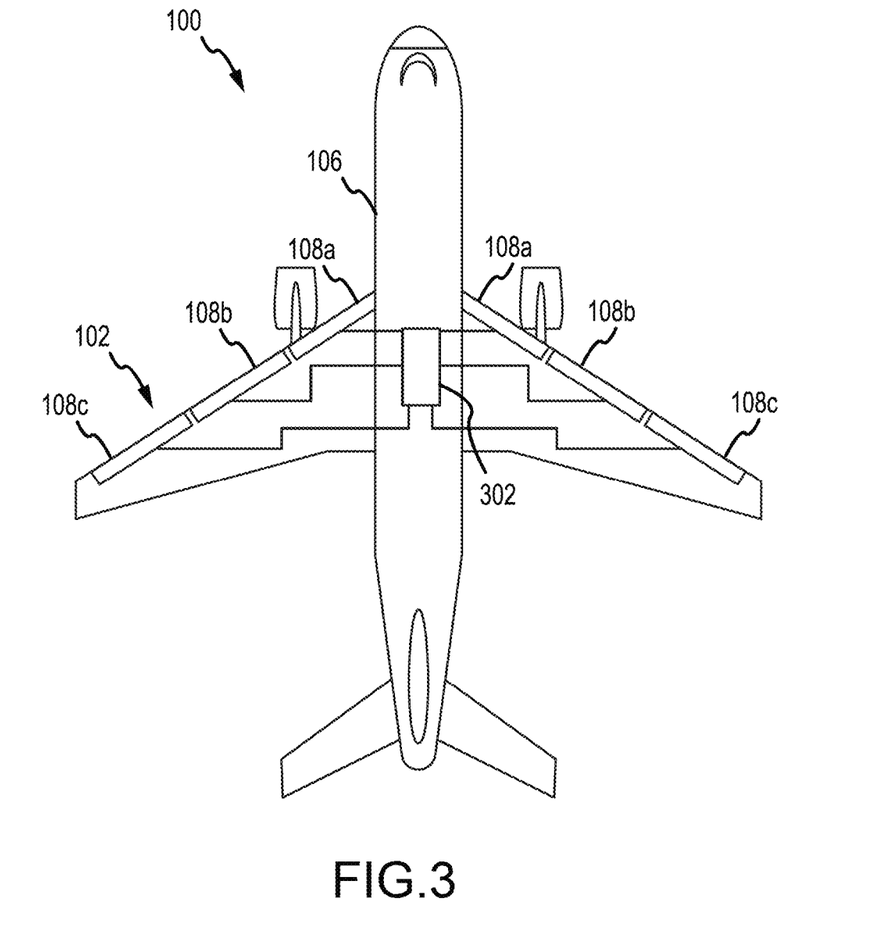
FIG. 3 illustrates a top view of the aircraft, in accordance with various embodiments.

Referring to FIG. 3, in accordance with various embodiments, a top view of the aircraft 100 is illustrated. In various embodiments, the wings 102 may comprise the deicing assembly 108. In various embodiments, the deicing assembly 108 may include multiple deicing assembly zones 108a, 108b, and 108c. In various embodiments, deicing assembly zone 108a may be located at a proximal end of the wings 102 adjacent the fuselage 106, deicing assembly zone 108c may be located at a distal end of the wings 102, and deicing assembly zone 108b may be located on the wings 102 between deicing assembly zone 108a and deicing assembly zone 108c. In various embodiments, each of the deicing assembly zones 108a, 108b, and 108c may be individually coupled to a controller 302. In various embodiments, the controller 302 may comprise one or more processors configured to implement various logical operations in response to execution of instructions, for example, instructions stored on a non-transitory, tangible, computer-readable medium. The one or more processors can be a general-purpose processor, a microprocessor, a microcontroller, a digital signal processor (DSP), an application specific integrated circuit (ASIC), a field programmable gate array (FPGA) or other programmable logic device, discrete or transistor logic, discrete hardware components, or any combination thereof. In various embodiments, the controller 302 may further comprise memory to store data, executable instructions, system program instructions, and/or controller instructions to implement the control logic of the controller 302.

System program instructions and/or controller instructions may be loaded onto a non-transitory, tangible computer-readable medium having instructions stored thereon that, in response to execution by the controller 302, cause the controller 302 to perform various operations. The term "non-transitory" is to be understood to remove only propagating transitory signals per se from the claim scope and does not relinquish rights to all standard computer-readable media that are not only propagating transitory signals per se. Stated another way, the meaning of the term "non-transitory computer-readable medium" and "non-transitory computer-readable storage medium" should be construed to exclude only those types of transitory computer-readable media which were found in *In Re Nuijten* to fall outside the scope of patentable subject matter under 35 U.S.C. § 101.

Figure 4:
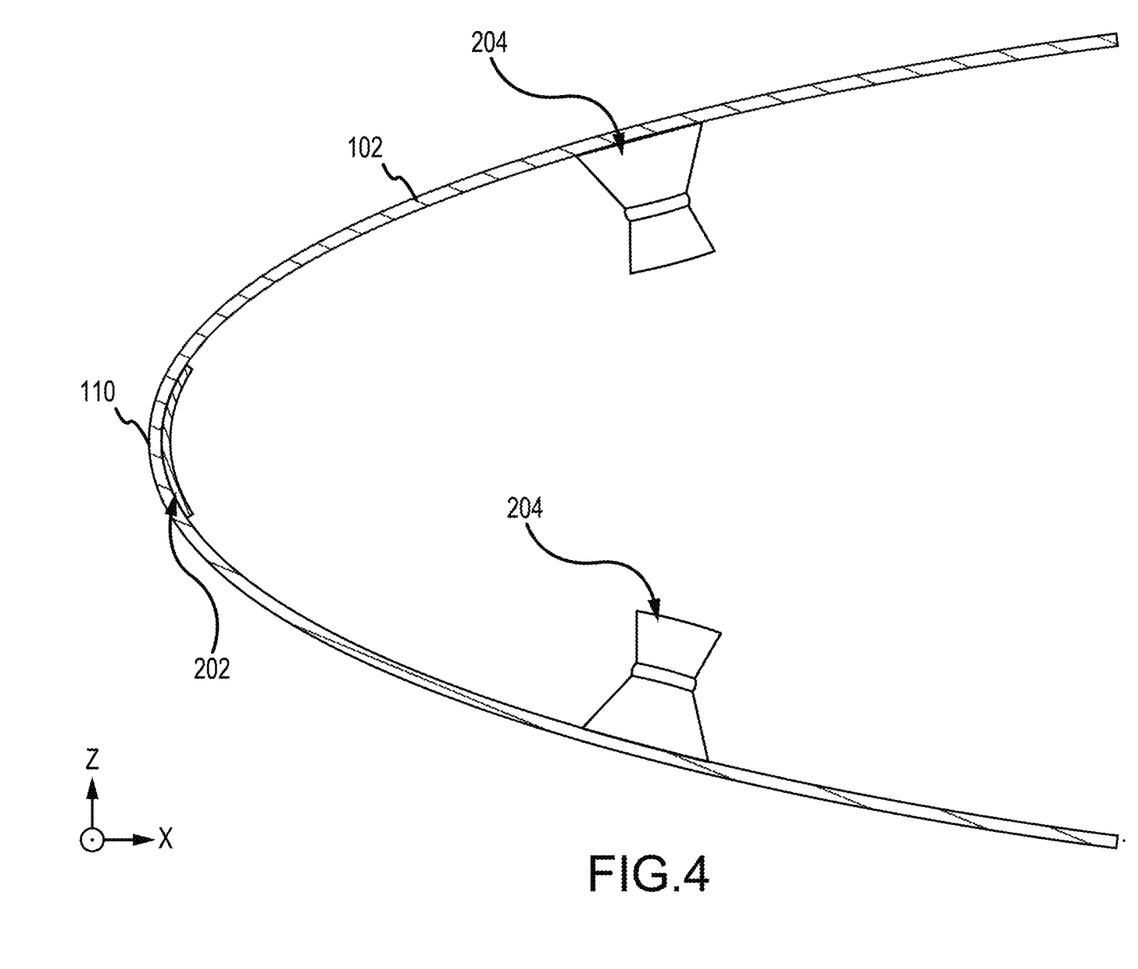
FIG. 4 illustrates a cross section of an aircraft structure is illustrated, in accordance with various embodiments.

Referring to FIG. 4, in accordance with various embodiments, a cross section of an aircraft structure 102, such as a wing, vertical stabilizer, or horizontal stabilizer, among others, is illustrated. In various embodiments, the at least one energy harvester and anti-icing device 202 is disposed along an internal portion of the leading edge 110 of the aircraft structure 102. In various embodiments, the at least one energy harvester and anti-icing device 202 may be a prestressed flexible low-frequency piezoelectric patch. In various embodiments, responsive to electrical power generated by the at least one energy harvester and anti-icing device 202 being greater than a first threshold and electrical power drawn by the at least one energy harvester and anti-icing device 202 being less than a second threshold, the at least one energy harvester and anti-icing device 202 is configured to function as an energy harvester, the harvested electrical power stored in the energy storage device. In various embodiments, during icing conditions, the electrical power generated by the at least one energy harvester and anti-icing device 202 may drop below the first threshold. In various embodiments, responsive to the electrical power generated by the at least one energy harvester and anti-icing device 202 dropping below the first threshold thereby indicating icing conditions, the at least one energy harvester and anti-icing device 202 is configured to function as a low-frequency actuator for anti-icing. In that regard, in various embodiments, the at least one energy harvester and anti-icing device 202 is configured to produce continuous, low-frequency vibrations. In various embodiments, the low-frequency vibrations may be between 1 kilohertz (kHz) and 7 kHz. In various embodiments, the low-frequency vibrations may be between 2 kHz and 6 kHz. In various embodiments, the low-frequency vibrations may be less than 5 kHz. In various embodiments, the at least one deicing device 204 is disposed along an internal portion of the upper and lower portions the aircraft structure 102 downstream, i.e., in an aft direction of the aircraft, of the leading edge 110. In various embodiments, the at least one deicing device 204 may be a high-frequency ultrasonic prestressed transducer, a high-frequency ultrasonic patch, a high-frequency ultrasonic disk, or a low-frequency patch, or any combination thereof. In that regard, in various embodiments, if the at least one deicing device 204 is a high-frequency ultrasonic prestressed transducer, a high-frequency ultrasonic patch, or a high-frequency ultrasonic disk, the at least one deicing device 204 is configured to produce periodic high-frequency vibrations. In various embodiments, the periodic high-frequency vibrations may be between 20 kHz and 50 kHz. In various embodiments, the periodic high-frequency vibrations may be between 30 kHz and 40 kHz. In various embodiments, the periodic high-frequency vibrations may be greater than 30 kHz. In various embodiments, the if the at least one deicing device 204 is a low-frequency patch, the at least one deicing device 204 is configured to produce periodic low-frequency vibrations. In various embodiments, the periodic low-frequency vibrations may be between 1 kilohertz (kHz) and 7 kHz. In various embodiments, the periodic low-frequency vibrations may be between 2 kHz and 6 kHz. In various embodiments, the periodic low-frequency vibrations may be less than 5 kHz. In various embodiments, the periodic high-frequency vibrations or low-frequency vibrations may occur less than 30 seconds. In various embodiments, a low ice adhesion (LIA) coating may also be applied to exposed exterior portions of the upper portion the aircraft structure 102, the lower portion the aircraft structure 102, or the leading edge 110 of the aircraft structure 102. In various embodiments, the LIA coating may be a hydrophobic coating or a superhydrophobic coating, among others. In various embodiments, the LIA coating may include materials such as polystyrene, carbon nano tubes (CNT), or silica nano, among others. In various embodiments, the LIA coating helps to reduce the ice adhesion to surface and hence, provides easier deicing with activation of the at least one deicing device 204.

Figure 5A:
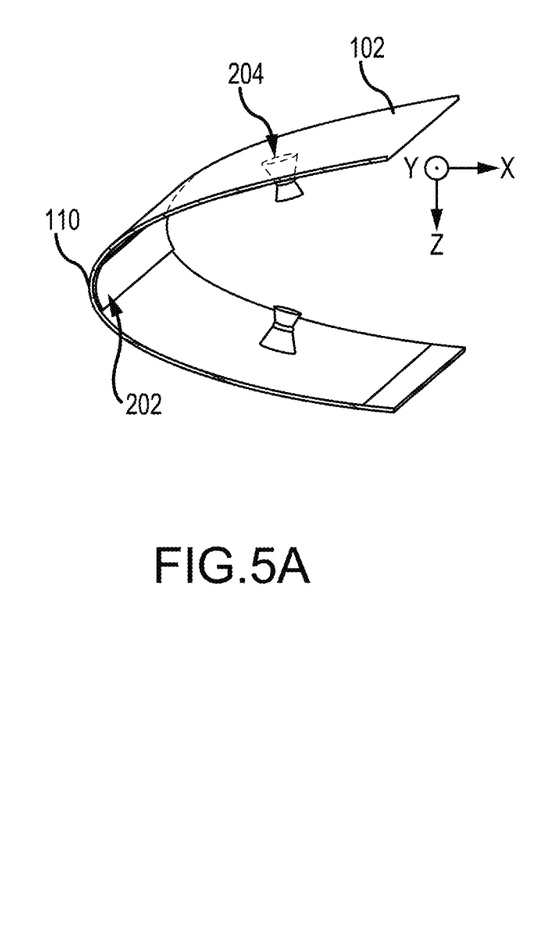
FIGS. 5A, 5B, and 5C illustrate isometric cross-sectional views of an aircraft structure, in accordance with various embodiments.
Figure 5B:
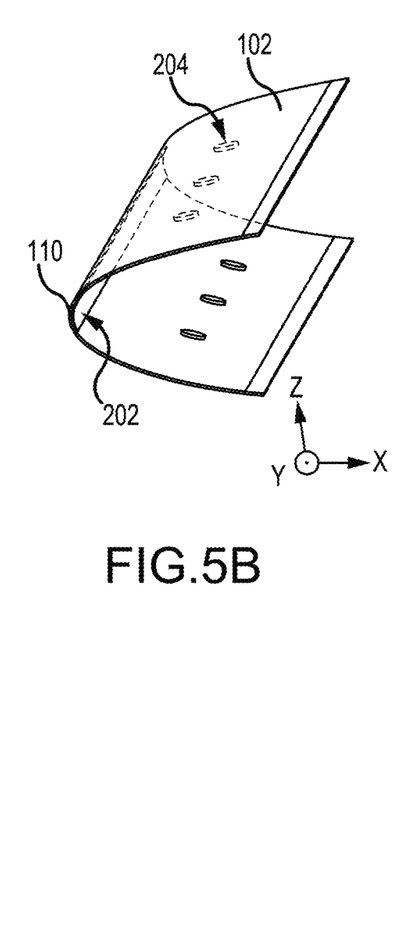
Figure 5C:
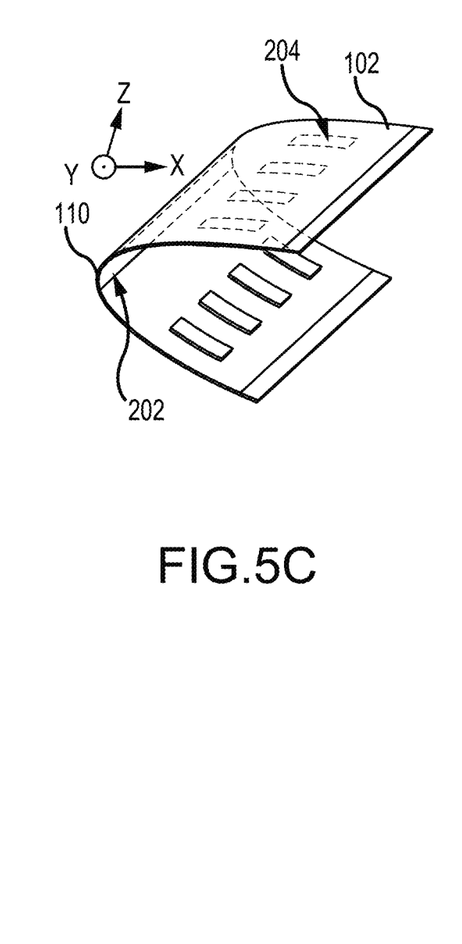

Referring to FIGS. 5A, 5B, and 5C, in accordance with various embodiments, isometric cross-sectional views of an aircraft structure 102 are illustrated. In various embodiments, as is illustrated in FIG. 5A, the at least one energy harvester and anti-icing device 202 is disposed along an internal portion of the leading edge 110 of the aircraft structure 102. In various embodiments, the at least one deicing device 204, which in FIG. 5A is a high-frequency ultrasonic prestressed transducer, is disposed along an internal portion of the upper and lower portions of the aircraft structure 102 downstream, i.e., in an aft direction of the aircraft, of the leading edge 110. In various embodiments, as is illustrated in FIG. 5B, the at least one energy harvester and anti-icing device 202 is disposed along an internal portion of the leading edge 110 of the aircraft structure 102. In various embodiments, the at least one deicing device 204, which in FIG. 5B is either a high-frequency ultrasonic patch or a high-frequency ultrasonic disk, is disposed along an internal portion of the upper and lower portions of the aircraft structure 102 downstream, i.e., in an aft direction of the aircraft, of the leading edge 110. In various embodiments, as is illustrated in FIG. 5C, the at least one energy harvester and anti-icing device 202 is disposed along an internal portion of the leading edge 110 of the aircraft structure 102. In various embodiments, the at least one deicing device 204, which in FIG. 5C is a low-frequency patch, is disposed along an internal portion of the upper and lower portions of the aircraft structure 102 downstream, i.e., in an aft direction of the aircraft, of the leading edge 110.

Figure 6:
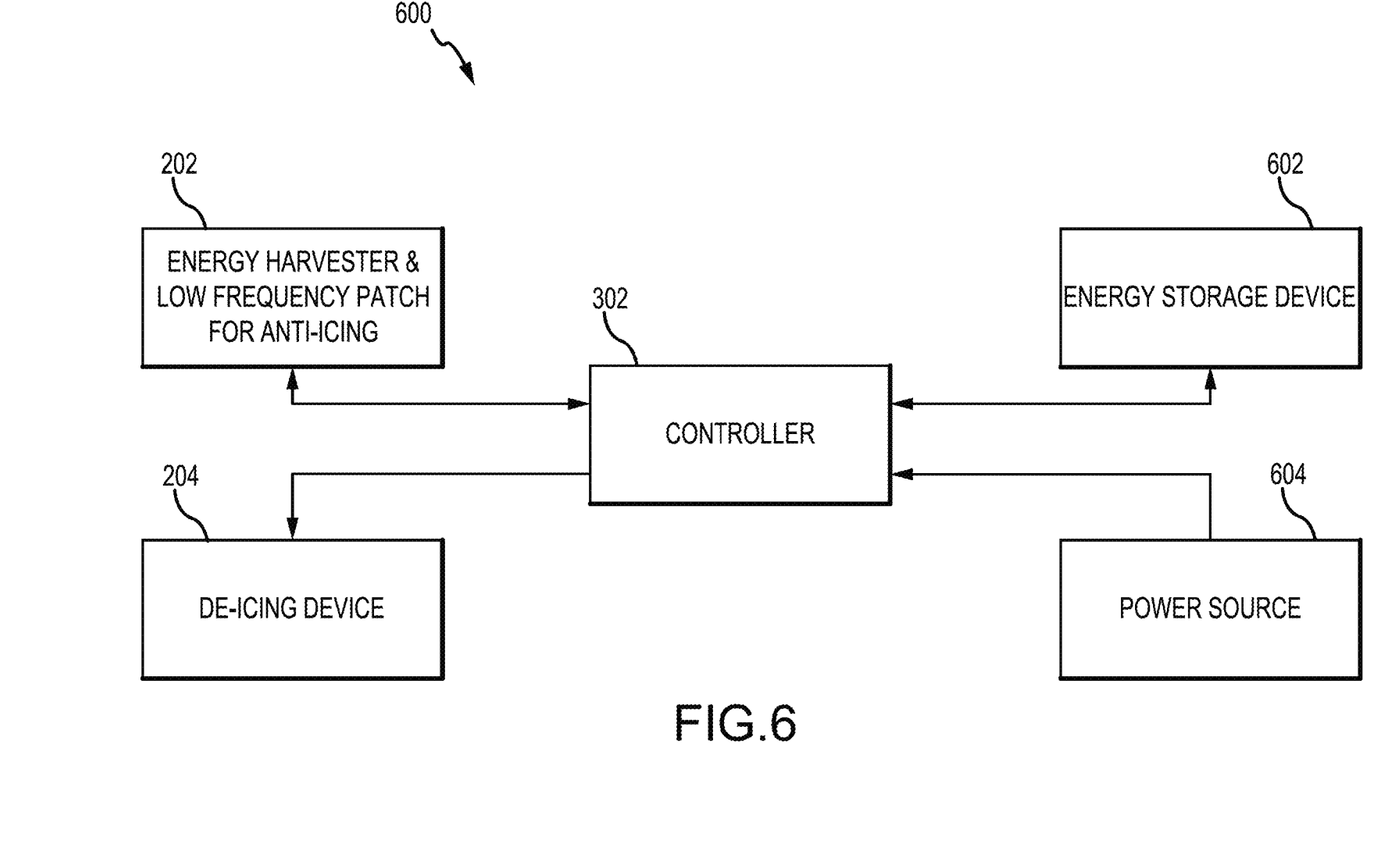
FIG. 6 illustrates a functional block diagram of a sustainable hybrid piezoelectric matrix ice protection system, in accordance with various embodiments.

Referring to FIG. 6, in accordance with various embodiments, a functional block diagram of a sustainable hybrid piezoelectric matrix ice protection system 600 is illustrated. In various embodiments, controller 302 is coupled to the at least one energy harvester and anti-icing device 202 and the at least one deicing device 204. In various embodiments, the at least one energy harvester and anti-icing device 202 is configured to function as an energy harvester during dry flight conditions. In that regard, in various embodiments, responsive to the controller 302 determining that the electrical power generated by the at least one energy harvester and anti-icing device being greater than the first threshold and electrical power drawn by the at least one energy harvester and anti-icing device being less than the second threshold, the controller 302 directs the harvested power to an energy storage device 602 where the harvested power is stored. In various embodiments, the energy storage device 602 may not only store the harvested power but also provide stored power back to the controller during icing conditions. In various embodiments, the energy storage device 602 may provide power to other devices within the aircraft 100. In various embodiments, the energy storage device 602 may be coupled to the power source 604.

In various embodiments, during icing conditions, the electrical power generated by the at least one energy harvester and anti-icing device 202 may drop below the first threshold. In various embodiments, the controller 302 may detect that the electrical power generated by the at least one energy harvester and anti-icing device 202 dropping below the first threshold. In that regard, in various embodiments, responsive to the controller 302 determining that the electrical power generated by the at least one energy harvester and anti-icing device 202 has dropped below the first threshold, the controller 302 may direct power from the energy storage device 602 or the power source 604 or both the energy storage device 602 and the power source 604 to the at least one energy harvester and anti-icing device 202 so that the at least one energy harvester and anti-icing device 202 produces continuous, low-frequency vibrations. In various embodiments, the low-frequency vibrations may be between 1 kilohertz (kHz) and 7 kHz. In various embodiments, the low-frequency vibrations may be between 2 kHz and 6 kHz. In various embodiments, the low-frequency vibrations may be less than 5 kHz. Additionally, in various embodiments, responsive to the controller 302 determining that the electrical power generated by the at least one energy harvester and anti-icing device 202 has dropped below the first threshold, the controller 302 may direct power from the energy storage device 602 or the power source 604 or both the energy storage device 602 and the power source 604 to the at least one deicing device 204 so that the at least one deicing device 204 produces either periodic high-frequency vibrations or periodic low-frequency vibrations or both periodic high-frequency vibrations and periodic low-frequency vibrations.

Figure 7:
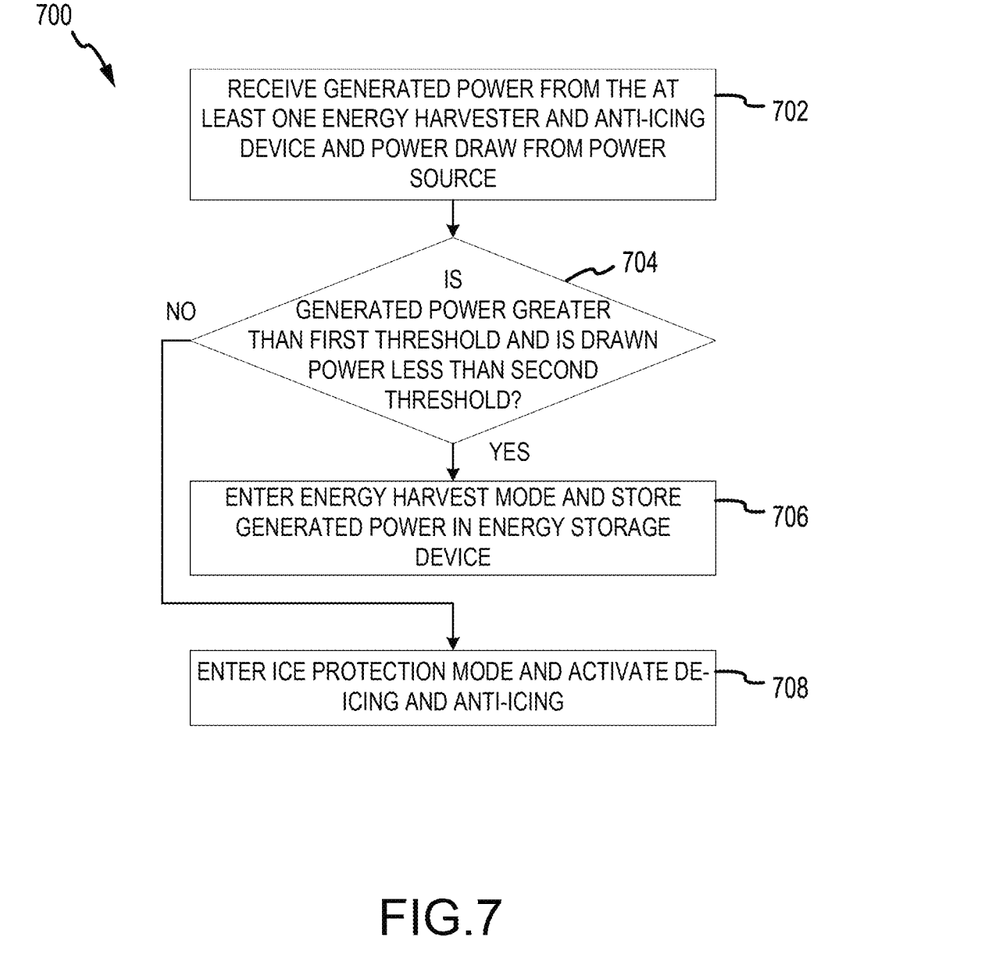
FIG. 7 illustrates a method for providing sustainable hybrid piezoelectric matrix ice protection, in accordance with various embodiments.

Referring to FIG. 7, in accordance with various embodiments, a method 700 for providing sustainable hybrid piezoelectric matrix ice protection is illustrated. The method 700 may be performed by a controller 302 described above with respect to FIG. 3. At block 702, the controller 302 receives an indication of generated electrical power from the at least one energy harvester and anti-icing device and power draw from power source. At block 704, the controller 302 determines whether the electrical power generated by the at least one energy harvester and anti-icing device is greater than a first threshold and electrical power drawn by the at least one energy harvester and anti-icing device is less than a second threshold. If at block 704 the controller 302 determines that the electrical power generated by the at least one energy harvester and anti-icing device is greater than the first threshold and electrical power drawn by the at least one energy harvester and anti-icing device is less than the second threshold, then, at block 706, the controller 302 enters energy harvest mode and directs the harvested power to an energy storage device where the harvested power is stored. If at block 704 the controller 302 determines that the electrical power generated by the at least one energy harvester and anti-icing device is less than the first threshold, then, at block 708, the controller 302 direct power from the energy storage device or the power source or both the energy storage device and the power source to the at least one energy harvester and anti-icing device so that the at least one energy harvester and anti-icing device produces continuous, low-frequency vibrations and to the at least one deicing device so that the at least one deicing device produces either periodic high-frequency vibrations or periodic low-frequency vibrations or both periodic high-frequency vibrations and periodic low-frequency vibrations.

Benefits, other advantages, and solutions to problems have been described herein with regard to specific embodiments. Furthermore, the connecting lines shown in the various figures contained herein are intended to represent exemplary functional relationships and/or physical couplings between the various elements. It should be noted that many alternative or additional functional relationships or physical connections may be present in a practical system. However, the benefits, advantages, solutions to problems, and any elements that may cause any benefit, advantage, or solution to occur or become more pronounced are not to be construed as critical, required, or essential features or elements of the disclosure. The scope of the disclosure is accordingly to be limited by nothing other than the appended claims, in which reference to an element in the singular is not intended to mean "one and only one" unless explicitly so stated, but rather "one or more." Moreover, where a phrase similar to "at least one of A, B, or C" is used in the claims, it is intended that the phrase be interpreted to mean that A alone may be present in an embodiment, B alone may be present in an embodiment, C alone may be present in an embodiment, or that any combination of the elements A, B and C may be present in a single embodiment; for example, A and B, A and C, B and C, or A and B and C. Different cross-hatching is used throughout the figures to denote different parts but not necessarily to denote the same or different materials.

Systems, methods, and apparatus are provided herein. In the detailed description herein, references to "one embodiment," "an embodiment," "various embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments.

Numbers, percentages, or other values stated herein are intended to include that value, and also other values that are about or approximately equal to the stated value, as would be appreciated by one of ordinary skill in the art encompassed by various embodiments of the present disclosure. A stated value should therefore be interpreted broadly enough to encompass values that are at least close enough to the stated value to perform a desired function or achieve a desired result. The stated values include at least the variation to be expected in a suitable industrial process, and may include values that are within 10%, within 5%, within 1%, within 0.1%, or within 0.01% of a stated value. Additionally, the terms "substantially," "about" or "approximately" as used herein represent an amount close to the stated amount that still performs a desired function or achieves a desired result. For example, the term "substantially," "about" or "approximately" may refer to an amount that is within 10% of, within 5% of, within 1% of, within 0.1% of, and within 0.01% of a stated amount or value.

Furthermore, no element, component, or method step in the present disclosure is intended to be dedicated to the public regardless of whether the element, component, or method step is explicitly recited in the claims. No claim element herein is to be construed under the provisions of 35 U.S.C. 112(f) unless the element is expressly recited using the phrase "means for." As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

Finally, it should be understood that any of the above-described concepts can be used alone or in combination with any or all of the other above-described concepts. Although various embodiments have been disclosed and described, one of ordinary skill in this art would recognize that certain modifications would come within the scope of this disclosure. Accordingly, the description is not intended to be exhaustive or to limit the principles described or illustrated herein to any precise form. Many modifications and variations are possible in light of the above teaching.

What is claimed is:

1. A sustainable hybrid piezoelectric matrix ice protection system, comprising:
    at least one energy harvester and anti-icing device; and
    an energy storage device,
    wherein, responsive to electrical power generated by the at least one energy harvester and anti-icing device being greater than a first threshold, storing, by the at least one energy harvester and anti-icing device, the electrical power in the energy storage device, and
    wherein, responsive to the electrical power generated by the at least one energy harvester and anti-icing device being less than the first threshold, generating, by the at least one energy harvester and anti-icing device, continuous, low-frequency vibrations for anti-icing.

2. The system of claim 1, wherein the at least one energy harvester and anti-icing device is disposed along an internal portion of a leading edge of an aircraft structure of an aircraft and wherein a low ice adhesion (LIA) coating is applied to an exterior portion of the leading edge of the aircraft structure.

3. The system of claim 1, wherein generating the continuous, low-frequency vibrations for anti-icing utilizes the electrical power from at least one of a power source or the energy storage device.

4. The system of claim 1, further comprising:
    at least one deicing device,
    wherein responsive to the electrical power generated by the at least one energy harvester and anti-icing device being less than the first threshold, drawing, by the at least one deicing device, the electrical power from a power source to generate periodic high-frequency vibrations for deicing by the at least one deicing device.

5. The system of claim 4, wherein the at least one deicing device is at least one of a high-frequency ultrasonic prestressed transducer, a high-frequency ultrasonic patch, or a high-frequency ultrasonic disk, wherein the at least one deicing device is disposed along an internal portion of upper and lower portions of an aircraft structure, downstream of a leading edge of the aircraft structure, and wherein a low ice adhesion (LIA) coating is applied to an exterior portion of the upper and lower portions of the aircraft structure, downstream of the leading edge of the aircraft structure.

6. The system of claim 1, further comprising:
    at least one deicing device,
    wherein responsive to the electrical power generated by the at least one energy harvester and anti-icing device being less than the first threshold, drawing, by the at least one deicing device, the electrical power from a power source to generate periodic low-frequency vibrations for deicing by the at least one deicing device.

7. The system of claim 6, wherein the at least one deicing device is a low-frequency patch, wherein the at least one deicing device is disposed along an internal portion of upper and lower portions of an aircraft structure, downstream of a leading edge of the aircraft structure, and wherein a low ice adhesion (LIA) coating is applied to an exterior portion of the upper and lower portions of the aircraft structure, downstream of the leading edge of the aircraft structure.

8. An aircraft, comprising:
    an aircraft structure; and
    a sustainable hybrid piezoelectric matrix ice protection system, wherein the sustainable hybrid piezoelectric matrix ice protection system comprises:
        at least one energy harvester and anti-icing device; and
        an energy storage device,
        wherein, responsive to electrical power generated by the at least one energy harvester and anti-icing device being greater than a first threshold, storing, by the at least one energy harvester and anti-icing device, the electrical power in the energy storage device, and
        wherein, responsive to the electrical power generated by the at least one energy harvester and anti-icing device being less than the first threshold, generating, by the at least one energy harvester and anti-icing device, continuous, low-frequency vibrations for anti-icing.

9. The aircraft of claim 8, wherein the at least one energy harvester and anti-icing device is disposed along an internal portion of a leading edge of the aircraft structure of the aircraft and wherein a low ice adhesion (LIA) coating is applied to an exterior portion of the leading edge of the aircraft structure.

10. The aircraft of claim 8, wherein the sustainable hybrid piezoelectric matrix ice protection system further comprises:
a power source,
wherein generating the continuous, low-frequency vibrations for anti-icing utilizes the electrical power from at least one of the power source or the energy storage device.

11. The aircraft of claim 8, wherein the sustainable hybrid piezoelectric matrix ice protection system further comprises:
at least one deicing device,
wherein responsive to the electrical power generated by the at least one energy harvester and anti-icing device being less than the first threshold, drawing the electrical power from a power source to generate periodic high-frequency vibrations for deicing by the at least one deicing device.

12. The aircraft of claim 11, wherein the at least one deicing device is at least one of a high-frequency ultrasonic prestressed transducer, a high-frequency ultrasonic patch, or a high-frequency ultrasonic disk, wherein the at least one deicing device is disposed along an internal portion of upper and lower portions of the aircraft structure, downstream of a leading edge of the aircraft structure, and wherein a low ice adhesion (LIA) coating is applied to an exterior portion of the upper and lower portions of the aircraft structure, downstream of the leading edge of the aircraft structure.

13. The aircraft of claim 8, wherein the sustainable hybrid piezoelectric matrix ice protection system further comprises:
at least one deicing device,
wherein responsive to the electrical power generated by the at least one energy harvester and anti-icing device being less than the first threshold, drawing the electrical power from a power source to generate periodic low-frequency vibrations for deicing by the at least one deicing device.

14. The aircraft of claim 13, wherein the at least one deicing device is a low-frequency patch, wherein the at least one deicing device is disposed along an internal portion of upper and lower portions of the aircraft structure, downstream of a leading edge of the aircraft structure, and wherein a low ice adhesion (LIA) coating is applied to an exterior portion of the upper and lower portions of the aircraft structure, downstream of the leading edge of the aircraft structure.

15. A method for sustainable hybrid piezoelectric matrix ice protection system, comprising:
receiving, by a controller, an indication of generated electrical power from at least one energy harvester and anti-icing device;
determining, by the controller, whether electrical power generated by the at least one energy harvester and anti-icing device is greater than a first threshold;
responsive to the electrical power generated by the at least one energy harvester and anti-icing device being greater than the first threshold, storing, by the controller, the electrical power in an energy storage device; and
responsive to the electrical power generated by the at least one energy harvester and anti-icing device being less than the first threshold, providing, by the controller, the electrical power to the at least one energy harvester and anti-icing device for generating continuous, low-frequency vibrations for anti-icing.

16. The method of claim 15, wherein the at least one energy harvester and anti-icing device is disposed along an internal portion of a leading edge of an aircraft structure of an aircraft and wherein a low ice adhesion (LIA) coating is applied to an exterior portion of the leading edge of the aircraft structure.

17. The method of claim 15, wherein the controller provides the electrical power for generating the continuous, low-frequency vibrations for anti-icing from at least one of a power source or the energy storage device.

18. The method of claim 15, further comprising:
responsive to the electrical power generated by the at least one energy harvester and anti-icing device being less than the first threshold, providing, by the controller, the electrical power to at least one deicing device for generating periodic high-frequency vibrations for deicing by the at least one deicing device.

19. The method of claim 18, wherein the at least one deicing device is at least one of a high-frequency ultrasonic prestressed transducer, a high-frequency ultrasonic patch, or a high-frequency ultrasonic disk, wherein the at least one deicing device is disposed along an internal portion of upper and lower portions of an aircraft structure, downstream of a leading edge of the aircraft structure, and wherein a low ice adhesion (LIA) coating is applied to an exterior portion of the upper and lower portions of the aircraft structure, downstream of the leading edge of the aircraft structure.

20. The method of claim 15, further comprising:
responsive to the electrical power generated by the at least one energy harvester and anti-icing device being less than the first threshold, providing, by the controller, the electrical power to at least one deicing device for generating periodic low-frequency vibrations for deicing by the at least one deicing device, wherein the at least one deicing device is a low-frequency patch, wherein the at least one deicing device is disposed along an internal portion of upper and lower portions of an aircraft structure, downstream of a leading edge of the aircraft structure, and wherein a low ice adhesion (LIA) coating is applied to an exterior portion of the upper and lower portions of the aircraft structure, downstream of the leading edge of the aircraft structure.

* * * * *